(12) United States Patent
Hanssen et al.

(10) Patent No.: US 8,823,926 B2
(45) Date of Patent: Sep. 2, 2014

(54) METHOD AND APPARATUS FOR VISUALIZING A SIGNATURE MARK ON A SPECTACLE LENS

(71) Applicant: Carl Zeiss Vision International GmbH, Aalen (DE)

(72) Inventors: Adalbert Hanssen, Aalen (DE); Matthias Hornauer, Lauchheim-Huelen (DE)

(73) Assignee: Carl Zeiss Vision International GmbH, Aalen (DE)

( * ) Notice: Subject to any disclaimer, the term of this patent is extended or adjusted under 35 U.S.C. 154(b) by 0 days.

(21) Appl. No.: 13/684,398

(22) Filed: Nov. 23, 2012

(65) Prior Publication Data

US 2013/0148111 A1    Jun. 13, 2013

Related U.S. Application Data

(60) Provisional application No. 61/563,661, filed on Nov. 25, 2011.

(30) Foreign Application Priority Data

Nov. 25, 2011 (DE) .......................... 10 2011 119 806

(51) Int. Cl.
*G01B 9/00* (2006.01)
*G01M 11/02* (2006.01)
*G03F 7/20* (2006.01)
*G01M 11/08* (2006.01)

(52) U.S. Cl.
CPC ........... *G03F 7/706* (2013.01); *G01M 11/0278* (2013.01); *G01M 11/0235* (2013.01); *G01M 11/081* (2013.01)

USPC .......................................................... 356/124

(58) Field of Classification Search
CPC ........................................................ G03F 7/706
USPC ........................................... 356/124, 346, 374
See application file for complete search history.

(56) References Cited

U.S. PATENT DOCUMENTS 3,892,494 A    7/1975    Baker et al.
4,149,896 A    4/1979    Faulstich et al.
(Continued)

FOREIGN PATENT DOCUMENTS

DE    43 43 345 A1    6/1995
DE    44 34 699 A1    4/1996
(Continued)

OTHER PUBLICATIONS

English translation and Office action of the Japanese Patent Office dated Jan. 7, 2010 in the corresponding Japanese patent application 2006-519826.

(Continued)

*Primary Examiner* — Tarifur Chowdhury
*Assistant Examiner* — MD Rahman
(74) *Attorney, Agent, or Firm* — Walter Ottesen P.A.

(57) ABSTRACT

A method and an apparatus serve for visualizing a signature mark on a spectacle lens. In order to identify the signature mark, an illumination light beam is directed onto the spectacle lens, which impinges on the spectacle lens, after impinging on the spectacle lens is reflected at a retroreflector, impinges once again on the spectacle lens, and finally is passed as an observation light beam to a camera. A reflection region of the illumination light beam on the reflector is varied by means of a moved first optical element.

21 Claims, 6 Drawing Sheets

(56) References Cited

U.S. PATENT DOCUMENTS

| | | | |
|---|---|---|---|
| 4,180,325 A | 12/1979 | Humphrey | |
| 4,190,366 A * | 2/1980 | Doyle | 356/455 |
| 4,265,540 A * | 5/1981 | Doyle | 356/455 |
| 4,310,242 A | 1/1982 | Genco et al. | |
| 5,469,261 A | 11/1995 | Hellmuth et al. | |
| 5,523,836 A | 6/1996 | Minix | |
| 5,867,259 A | 2/1999 | Yanagi et al. | |
| 5,971,537 A | 10/1999 | Fukuma et al. | |
| 6,075,591 A | 6/2000 | Vokhmin | |
| 6,552,774 B2 | 4/2003 | Hase et al. | |
| 6,671,039 B2 | 12/2003 | Yoda et al. | |
| 6,888,626 B2 | 5/2005 | Levecq et al. | |
| 7,423,741 B2 | 9/2008 | Hornauer et al. | |
| 7,715,023 B2 | 5/2010 | Yanagi et al. | |
| 7,728,962 B2 | 6/2010 | Hornauer et al. | |
| 2006/0192944 A1* | 8/2006 | Hornauer et al. | 356/124 |
| 2008/0018870 A1* | 1/2008 | Omura | 355/52 |

FOREIGN PATENT DOCUMENTS

| | | |
|---|---|---|
| EP | 0 169 444 A2 | 1/1986 |
| JP | 49-101082 | 9/1974 |
| JP | 10-132707 A | 5/1998 |
| JP | 2001-230205 A | 8/2001 |
| JP | 2001-351841 A | 12/2001 |
| JP | 2002-1638 A | 1/2002 |
| JP | 2002-22599 A | 1/2002 |
| JP | 2005-316436 A | 11/2005 |
| WO | WO 95/12809 A1 | 5/1995 |

OTHER PUBLICATIONS

English translation of Office action of the German Patent Office dated Feb. 28, 2012 in German patent application 10 2011 119 806.0 from which priority is claimed.
English translation and the Office action of the Japanese Patent Office dated May 28, 2014 in corresponding Japanese patent application 2012-256343.

* cited by examiner

METHOD AND APPARATUS FOR VISUALIZING A SIGNATURE MARK ON A SPECTACLE LENS

CROSS-REFERENCE TO RELATED APPLICATIONS

This application claims the priority of German patent application DE 10 2011 119 806.0, filed Nov. 25, 2011 and of U.S. provisional patent application No. 61/563,661, filed Nov. 25, 2011.

BACKGROUND OF THE INVENTION

The invention relates to a method for visualizing a mark or signature mark on a spectacle lens, in which, in order to identify the signature mark, an illumination light beam is directed onto the spectacle lens, which impinges on the spectacle lens, after impinging on the spectacle lens is reflected at a reflector embodied as a retroreflector, impinges once again on the spectacle lens, and finally is passed as an observation light beam to a camera.

The invention furthermore relates to an apparatus for visualizing a mark or signature mark on a spectacle lens, comprising an illumination light source arranged on a first side of the spectacle lens and sewing for generating an illumination light beam, for identifying the signature mark, a reflector embodied as a retroreflector and arranged on that side of the spectacle lens which is situated opposite the first side, and a camera for receiving an observation light beam coming from the spectacle lens.

Spectacle lenses, in particular so-called, progressive lenses, are provided with marks or signature marks, the position of which is detected and processed during the production of the spectacle lens in order that the spectacle lens is clamped, processed and stamped in a correct position and is finally introduced into the end customer's spectacles. Signature marks are applied to spectacle lenses in a targeted manner and permanently, to be precise by means of diamond scribing methods, by means of impression during the moulding of plastic spectacle lenses or by means of laser signing. In addition, the term "signature marks" in the context of the present invention also encompasses other irregularities—not applied in a targeted manner—of the spectacle lens, e.g. streaks or striations in the glass material or plastic.

When "spectacle lenses" are mentioned in the context of the present application, they should also be understood to mean contact lenses and other comparable optical components.

In order that the person wearing the spectacles is not disturbed by signature marks applied in a targeted manner during the use of the spectacles, said marks are designed such that they are discernible only under very specific lighting conditions. Therefore, it is difficult to identify the position of a signature mark on a spectacle lens during the production process. An additional complicating factor here is that the spectacle lenses in the production process have very different optical powers on account of the specific requirements of the persons subsequently wearing the spectacles. Within production, therefore, spectacle lenses having these different optical powers closely succeed one another, which therefore have to be taken into consideration in quick succession during the successive processing of individual spectacle lenses.

For monitoring progressive lenses at the distant and near reference points it is necessary to measure the power of the progressive lenses at defined coordinates on the spectacle lens, depending on the applied signature marks. The signature marks therefore have to be visualized for a manual or an automatic measurement. In the case of known methods and apparatuses, this is done by means of rhomboidal gratings or striped patterns which are imaged unsharply and the bright/dark edge transitions of which make the signature mark discernible.

What is disadvantageous about this known procedure, in particular during automatic identification of the signature marks, is that the grating is imaged with different magnifications depending on the power of the spectacle lens examined, namely depending on the respective dioptric power of the spectacle lens. It is therefore necessary, for identifying the signature marks, to implement a considerable complexity with regard to the algorithms used. Known methods hitherto have not led to totally reliable automatic identification. It is therefore necessary in practice nowadays that even in the case of automated test installations, specially trained workers have to intervene manually in the production process and correct erroneous identifications.

However, even when the signature marks are identified by means of a manual test procedure within a production process, the situation is similar. In this case, depending on the signature method used, different illumination is used to visualize the signature marks. In the case of known apparatuses, this is done by rearranging or changing over illumination units or the spectacle lens is led past under suitable illumination conditions, e.g. a remote bright-dark edge, and is observed. However, even with these methods the marks themselves can only be discerned unclearly, with the result that errors are possible in the positioning and orientation of the respective spectacle lens. This holds true also and precisely with regard to the time available for identifying the signature mark. For these reasons, particularly in the conventional procedure for preparing spectacle lenses it is necessary to mark out ("to dot") the spectacle lenses at the location of the signature mark by means of a felt tip pen or the like, which requires additional outlay in terms of labour and time.

Corresponding considerations also hold true for another area within the processing of such spectacle lenses, namely for automatic stamping machines, which, according to the present-day prior art, likewise need the assistance of an operator. Said operator observes the spectacle lenses on a screen in order to correct positions of signature marks that have not been automatically identified manually in the system, for example by means of trackball input. This disadvantage is likewise manifested in a reduction of the productivity of the video-assisted, manually actuated stamping machines.

U.S. Pat. No. 3,892,494 suggests a method and an apparatus for finding optical microeffects on optical components, for example lenses. In this case, a laser beam is directed through a beam splitter, namely a partly transmissive mirror, onto the component to be examined. The laser beam passes through the component and impinges, on the opposite side, on a retroreflector, for example a retroreflective film, from which it is reflected again through the component and returns along the same beam path until it is deflected at the beam splitter and directed onto a camera.

What is disadvantageous about this known procedure is that it can lead to problems in the case of spectacle lenses having very different flexures. This is because, owing to the very different flexures, the observation beam path has to be long and additionally stopped down in order to obtain a sufficient depth of focus. On the other hand, however, the structures of the retroreflector should not be imaged sharply, since it is indeed desirable to have a relatively homogeneous background in order to avoid misinterpretations. Consequently, in these applications the retroreflector has to he situated very far behind the plane of the spectacle lens to be measured and, in addition, it would have to be very large because strongly negative spectacle lenses image the retroreflector in a greatly demagnified fashion, such that the whole lens can no longer be seen over the retroreflector.

An additional factor is that in the context of the present invention it is not just a matter of identifying signature marks and other irregularities on spectacle lenses, but rather integrating this identification process into a measuring apparatus or into a processing process. In that case, however, a sensor is arranged behind the spectacle lens, that is to say on the same side as the retroreflector in the known apparatus, in order to measure physical properties of the spectacle lens. Therefore, for structural reasons it is not possible to arrange the retroreflector very far behind the plane of the spectacle lens in this case.

U.S. Pat. No. 4,310,242 suggests an arrangement for measuring the optical quality of windscreens on site. This also involves using an optical arrangement comprising a light source, a beam splitter, a retroreflector positioned behind the windscreen to be measured, and a camera. In this case, a fine pattern is projected through the beam splitter onto a retroreflective screen, in such a way that a real image of said pattern, which is deformed by the windscreen situated in the beam path, arises on the retroreflective screen. Via the beam splitter, the camera then likewise looks at the retroreflective screen in the protection direction through the windscreen to be tested. Inhomogeneities, stress birefringences, striations, etc. become clearly visible in this way, DE 43 43 345 A1 suggests methods and apparatuses for measuring the reflective and/or transmissive optical properties of a sample. In this case, measurement radiation is directed on to a sample and is reflected by the sample, such that it passes to a retroreflector, which sends the measurement radiation back again via the object to the light source, where coupling-out to a detector takes place. A further similar procedure is also described in EP 0 169 444 A2.

In a known vertex refractometer "Focovision SPV 1", a light beam is sent from a light source through a green filter and directed via a beam splitter on to the spectacle lens to be tested. The light beam passes through the spectacle lens and passes to a sensor head arranged behind the rear side of the spectacle lens. Physical properties of the spectacle lens can be measured in this way. Furthermore, a plane in which exchangeable illumination ancillary units can be arranged is situated on the rear side. These illumination ancillary units illuminate the spectacle lens from the rear, such that the signature marks become visible. A corresponding observation light beam passes from the spectacle lens to the beam splitter, is reflected there and is then led via further optical means to a camera. In the case of a first illumination ancillary unit, a very sharply delimited bright beam of light is directed onto the spectacle lens at a shallow angle. Signature marks that were produced by scratching then become brightly luminous against a dark background on account of the irregular shape of the scratch mark. By contrast, the second illumination ancillary unit is provided for spectacle lenses whose signature marks were not produced by scratching, but rather by impression or by laser beams. Said second illumination ancillary unit has a bright line grating illuminated from below and a plurality of auxiliary lenses which are arranged alongside one another and with which these luminous gratings are imaged to infinity.

The known apparatus is therefore relatively complex in terms of operating control. Furthermore, the location at which the measurement beam emitted by the light source is incident on the spectacle lens coincides with the location, at which the observation light beam emerges from the spectacle lens. This can lead to disturbances during the evaluation.

U.S. Pat. No. 5,867,259 also suggests an observation apparatus for concealed markings, i.e. signatures. In the case of this apparatus, a lens provided with the concealed marking is illuminated with an illumination light. The concealed marking is then observed as a shadow of the lens formed by the illumination light.

This apparatus has the disadvantage that the marking, depending on the type of lens, is displaced by the local prismatic effect thereof or is demagnified or magnified by the converging or diverging effect of the lens.

Furthermore, the documents U.S. Pat. Nos. 7,728,962 and 7,423,741 suggest an apparatus for visualizing a signature mark on a spectacle lens. Said documents propose moving, e.g. rotating, the retroreflector in order to obtain a background that is as homogeneous as possible and to blur the structures of the retroreflector.

In the case of such a simply rotating retroreflector, its angular velocity near the axis of rotation is very low, with the result that only little blurring of its structures occurs here. Therefore, the retroreflector should perform as far as possible a movement in the manner of a parallel rotary translation, e.g. on a cycloidal path. However, such movements, particularly if they are to be performed with a high frequency, can be balanced only with difficulty, and so the outlay in terms of apparatus is very high.

Therefore, the invention, is based on the problem of developing methods and apparatuses of the type mentioned in the introduction to the effect that the disadvantages mentioned are avoided. In particular, the intention is to make it possible to treat spectacle lenses within a production process in such a way that the signature marks applied thereto are identified in the correct position. All this is to be done with the simplest possible means appertaining to apparatus and method.

BRIEF SUMMARY OF INVENTION

According to one aspect of the invention, there is provided a method for visualizing a signature mark on a spectacle lens, in which an illumination light beam is directed onto the spectacle lens, which impinges on the spectacle lens, after impinging on the spectacle lens is reflected at a reflector embodied as a retroreflector, impinges once again as an observation light beam on the spectacle lens, and finally is passed to a camera, wherein a reflection region of the illumination light beam on the reflector is varied by means of a moved first optical element, wherein the illumination light beam impinges on the first optical element downstream of or after the spectacle lens.

According to a further aspect of the invention, there is provided an apparatus for visualizing a signature mark on a spectacle lens, comprising an illumination light source arranged on a first side of the spectacle lens and for generating an illumination light beam, for identifying the signature mark; a reflector embodied as a retroreflector and arranged on that side of the spectacle lens which is situated opposite the first side; a camera for receiving an observation light beam coming from the spectacle lens; wherein the apparatus furthermore comprises a first optical element for varying a reflection region of the illumination light beam on the reflector, wherein the first optical element is supported in a movable fashion, and wherein the first optical element is arranged downstream of or after the spectacle lens in a beam path of the illumination light beam.

When a reflection region is mentioned in the context of the present application, this is taken to mean that region on the reflective surface of the retroreflector in which the illumination light beam is reflected. If the illumination light beam is circular in its cross section, for example, and if the illumination light beam is deflected by means of a wedge-shaped prism as first optical element, the reflection region on the reflective surface of the retroreflector has an elliptical shape. In the case where the illumination light beam is influenced, by means of a tilted plane-parallel plate, for example, the circular shape of the illumination light beam can also be converted into a circular shape of the reflection region.

When a "retroreflector" is mentioned in the context of the present application, this should be understood to mean a surface which reflects incident light over a large range of angles of incidence substantially once again in the same direction from which said light is incident. In practice, for this purpose use is made of planar or curved surfaces which are provided with a retroreflective surface, e.g. glass beads, or on which a large number of small triple mirrors or reflectively coated triple prisms are fitted in a regular arrangement. Such surfaces are generally known from back reflectors of vehicles, traffic signs, light barriers, etc. For the method according to the invention it is advantageous if the individual retroreflective structures on the retroreflector are significantly smaller than 1 mm.

In the context of the present invention, "varied" is understood to mean that the location of the reflection region on the retroreflector changes over time. In this case, however, its shape, size and orientation can remain unchanged.

In the context of this application, the features "impinge downstream of the spectacle lens" and "arranged downstream of the spectacle lens" refer to the order in a beam path of the illumination light beam. The illumination light beam thus firstly impinges on the spectacle lens, in which case the illumination light beam can then be transmitted by (pass through) the spectacle lens or reflected by the latter. The term "impinge" can thus be understood as "transmit or reflect". The illumination light beam then impinges on the first optical element. The illumination light beam can also he transmitted by (pass through) the first optical element or be reflected by the latter. Afterwards in turn the illumination light beam is reflected by the retroreflector.

The proposed method and the proposed apparatus can therefore be provided in a transmissive or a reflective construction.

In the case of the transmissive construction, the illumination light beam passes through the spectacle lens and passes through it anew as an observation light beam. The first optical element is then arranged on that side of the spectacle lens which is situated opposite the first side.

In this case, the 'first side' of the spectacle lens is that side of the spectacle lens on which the illumination light source for generating an illumination light beam is arranged or which faces the illumination light source. The illumination light beam impinges on the spectacle lens in the mariner coming from the first side.

In the case of the reflective construction, the illumination light beam is reflected by the spectacle lens, in particular by its surface facing away from the illumination light source, and is reflected anew by the spectacle lens as an observation light beam. The first optical element is then arranged on the first side of the spectacle lens. In this case, consideration should he givers to complying with the Scheimpflug condition. Upon complying with the Scheimpflug condition, the image plane and the lens plane or principal lens plane of the camera and the plane of focus intersect in a straight line. In the case of the reflective construction, the plane of focus would he the nominal plane of the spectacle lens. Therefore, the camera, the retroreflector and the spectacle lens, or a nominal plane of the spectacle lens, should he arranged in such a way that the Scheimpflug condition is met for the imaging of the spectacle lens in the camera. The nominal plane of the spectacle lens is that imaged sharply.

After impinging on the spectacle lens, the illumination light beam can thus either pass through the spectacle lens or be reflected by the latter. The first optical element can either he arranged on that side of the spectacle lens which is situated opposite the first side. Alternatively, the first optical element can be arranged on the first side of the spectacle lens.

If the reflection region on the reflector is moved, then a homogeneous background is produced, from which the signature marks stand out significantly more clearly and thus with higher contrast. The spectacle, lenses to he tested appear uniformly bright during the measurement. However, at the edges of the signature marks scattering occurs to such a great extent that the scattered light no longer meets the retroreflection condition, with the consequence that the signature marks appear dark on a bright background. As a result of the movement of the first optical element and thus of the reflection region on the retroreflector, the structure of the retroreflector blurs and waves, inhomogeneities, contaminants, etc. of the retroreflector itself are no longer disturbing.

If the "signature marks" are spectacle lens irregularities not applied in a targeted manner, e.g. striations or streaks in the glass material or plastic, then they can be visualized by means of the proposed method and the proposed apparatus and the spectacle lens can thus be checked with regard to its quality.

If the optical element is embodied as a rotating wedge-shaped prism, for example, an illumination light beam incident on the first optical element is deflected by a certain angle. On account of the rotation of the wedge-shaped prism, the illumination light beam and the reflection region thereof on the retroreflector then describe circles. The radius of these circles is dependent on the wedge angle and on the distance between the first optical element and the retroreflector. If the retroreflector were then viewed through the rotating wedge-shaped first optical element, it would appear as if the retroreflector was moving in the manner of a parallel rotary translation, even though the retroreflector is actually fixed. in this way, a "virtual movement" of the retroreflector can thus be obtained, without the latter actually having to be moved however. This significantly simplifies the apparatus construction since a movement of a retroreflector on a cycloidal path or on a parallel rotary translation is very complicated to install or to balance. By contrast, balancing a rotational movement of a wedge-shaped prism is significantly easier. The wedge-shaped prism should he mounted on the outside, for example in an outer ring of a ball bearing. A suitable coupling to a drive device which rotates the wedge-shaped prism can engage on the outside of the ring.

In this way, a significantly simpler technical apparatus construction is obtained, which can be activated more rapidly on account of the lower complexity for balancing.

Furthermore, in this way, for example by means of the embodiment of the first optical element as a wedge-shaped prism or as a tilted plane-parallel plate, with very little complexity it is possible to avoid a situation where parts of the illumination light beam are blurred only slightly or are not blurred at all.

In one refinement of the method and of the apparatus, provision can be made for the retroreflector to be fixed. In this case, "fixed" should be understood to mean that the retroreflector does not move. In particular, the retroreflector does not more either translationally or rotationally relative to the spectacle lens or the illumination light source or the camera.

A simple apparatus construction is achieved in this way. This avoids the situation where the retroreflector has to be mounted and driven in some way. Alternatively, provision can also be made, of course, for the retroreflector to be moved in addition to the first optical element, in order to intensify the effect of the blurring of the structures of the retroreflector. In this case, the retroreflector can be moved linearly or rotationally, for example.

In a further refinement of the method, provision can be made for the reflection region of the illumination light beam on the reflector or retroreflector to be moved linearly. In this case, provision can be made for an angle of incidence of the illumination light beam on the first optical element to be varied, wherein the first optical element is tilted in an oscillating fashion relative to the illumination light beam.

Correspondingly, in the case of the apparatus, too, in one embodiment provision can be made for the apparatus to have a drive device, which is coupled to the first optical element in such a way that it tilts the first optical element in an oscillating fashion relative to the illumination light beam, in order to vary an angle of incidence of the illumination light beam on the first optical element.

Under certain circumstances, a resulting linear movement of the reflection region on the retroreflector can already suffice to bring about a sufficient blurring effect. Tilting the first optical element in an oscillating fashion can be easier to realize mechanically, under certain circumstances, depending on the rest of the apparatus construction. Furthermore, in this way, depending on the apparatus construction, the beam path of the illumination light beam can possibly be deflected or influenced in such a way that the total spatial arrangement of the apparatus is small. By way of example, this enables the retroreflector on the reflective surface thereof to be arranged parallel to an optical axis of the spectacle lens.

In a further refinement of the method, provision can be made for the reflection region of the illumination light beam on the reflector to be moved circularly or elliptically. In this case, provision can be made for the first optical element to be rotated about an axis running substantially parallel to an optical axis of the spectacle lens. The optical axis is the straight tine to which the two optical surfaces, the front side and the rear side, of the spectacle lens are perpendicular and along which light passes through the spectacle lens without being deflected. In the case of an aspherical spectacle tens, the optical axis should be understood to mean the axis of rotation of the spectacle lens.

Correspondingly, in a refinement of the apparatus, too, provision can be made for the apparatus to comprise a drive device, which is coupled to the first optical element in such a way that it rotates the first optical element about an axis running substantially parallel to an optical axis of the spectacle lens.

In this way, spectacle lens, first optical element and retroreflector can be arranged one behind another, in particular, in this case the distance between the retroreflector and the first optical element can be used to increase a radius of the circle arc described by the reflection region on the retroreflector. Furthermore, such a movement can generally be synchronized more easily with a frequency of a camera, for example. Ultimately, this type of movement of the first optical element, even at high movement frequencies, can result in smoother running than would be the case with tilting to and from.

The first optical element is embodied in such a way that it deflects the illumination light beam. Preferably, the first optical element is a prism having a wedge-shaped baseplate. However, the first optical element can, for example, also be a plane-parallel plate tilted with respect to an optical axis of the spectacle lens or a plate having at least one undulatory surface. In the case of the plate having at least one undulatory surface, consideration should be given to ensuring that the surface on the optical axis or the axis of rotation of the plate is not perpendicular to the optical axis or the axis of rotation, rather that a deflection takes place here as well.

In the case of such a refinement of the first optical element, the illumination light beam passes through the first optical element. In this respect, the first optical element should be mounted and driven on the outside, in order that the corresponding mounts and couplings or drive elements are not situated in the beam path of the illumination light beam. By way of example, the first optical element can be mounted rotatably in an outer ring. The first optical element can then be rotated for example by injecting compressed air in the bearing ring. However, provision can also be made for the first optical element to be fixedly connected to an outer ring and for the outer ring in turn to be mechanically driven on its outer side. By way of example, this can be done directly by means of a suitable wheel or else by the outer ring being wrapped with a corresponding continuous force transmission element, for example a belt or a chain, or else magnetically by the outer ring being driven by a rotating magnetic field, in a similar manner to the rotating part of a three-phase motor.

Furthermore, provision can be made for the first optical element to be a mirror. In particular, in this case provision can be made for the first optical element to be a mirror which is rotated in a wobbling fashion.

During wobbling rotation, the axis of rotation is oblique relative to the reflective surface of the mirror.

This can afford the advantage that a mounting or a drive of the mirror need not be effected via an outer ring, for instance, but rather can be effected in any desired manner on the rear side of the mirror. Such a construction may possibly be advantageous in terms of apparatus. Furthermore, a mirror e.g. does not change the optical properties of a measurement light beam that passes through the spectacle lens. In the case where an optical property of the spectacle lens is intended to be determined in parallel, a mirror as first optical element can thus be advantageous.

Furthermore, provision can be made of at least one optical guide element for guiding the illumination light beam through the spectacle lens and for guiding the observation light beam reflected through the spectacle lens by the reflector to the camera.

Furthermore, in one refinement of the apparatus provision can be made for the optical guide element to comprise at least one second optical element for guiding the illumination light beam through the spectacle lens and at least one third optical element for guiding the observation light beam reflected through the spectacle lens by the reflector to the camera.

In this way it is possible to realize more complex beam paths for the illumination light beam and the observation light beam, Furthermore, one refinement of a method can provide that, furthermore, for measuring a physical property of the spectacle lens, a measurement light beam is directed onto the spectacle lens and then forwarded to a sensor, and that the measurement light beam is generated by a first light source and the illumination light beam by a second light source, which are structurally different units.

Correspondingly, in one refinement of the apparatus provision can be made of a measurement light source—structurally different from the illumination light source—for generating a measurement light beam or a measurement of a physical property of the spectacle lens, a sensor and at least one fourth optical element for guiding the measurement light beam from the measurement light source to the spectacle lens and from the spectacle lens to the sensor.

The measure of using different structural components and at least in part also different beam paths for the beam path of the measurement light and of the illumination light makes it possible to separate cleanly from one another a decoupling of the processes of measuring physical properties of the spectacle lens and identifying signature marks on the spectacle lens.

The method according to the invention and the apparatus according to the invention with a moved optical element can he combined with a vertex refractometer in one development according to the invention, such that it is thereby possible to perform the measurement easily at those locations on the spectacle lens whose position is defined relative to the signature marks on the spectacle lens. For this purpose, the method according to the invention is combined with the vertex refractometer such that the image of the signature marks has to assume a specific position in the camera image while the measurement is being performed. For this purpose, use is made of an illumination beam path and a measurement beam path which can be optically decoupled in the manner explained in greater detail, even though they use the same paths in part.

In refinements of the method and of the apparatus, the reflector can also he moved substantially periodically, in particular rotationally. Alternatively, however, a movement in a parallel rotary translation is also possible, during which the retroreflector is displaced e.g. in a plane and its midpoint in this case moves on a circular path, without the retroreflector furthermore being rotated. Moreover, a linear movement of the retroreflector is also possible. All these movements run substantially transversely with respect to the direction of propagation of the illumination light beam.

The first optical element can also be moved periodically or driven in such a way that the reflection region on the reflector performs a periodic movement.

If the reflector and/or the first optical element are/is moved periodically, a further preferred embodiment of the invention consists in adapting the frequency of this periodic movement to a synchronizing signal of the camera. In particular, it is preferred if the frequency is rotational-speed-synchronized, in particular phase-synchronized, with the synchronizing signal.

This measure has the advantage that the electronic evaluation of the video signal derived from the observation light beam is possible in a particularly simple manner because a blurring of the structures of the retroreflector is then equally good in all recorded images or video frames.

In a further group of refinements, a good effect is achieved by virtue of the reflector being arranged at a distance of 1 cm to 30 cm from the spectacle lens. In other words, a length of the beam path of the illumination light beam from the spectacle lens to the reflector is intended to he approximately 1 cm to 30 cm. This measure has the advantage that a particularly uniform background arises as a result of the moved retroreflector, in this case, an imaginary normal to the surface of the reflector is not necessarily exactly parallel to the optical axis of the illumination.

A particularly good effect is furthermore achieved if a video signal generated from the observation light beam in the camera is increased in terms of its contrast by at least one convolution operation using finite neighbourhoods in each case. Preferably, high spatial frequencies, e.g. on account of a differentiating effect, are increased here to a greater extent than low spatial frequencies The video signal generated from the observation light beam in the camera can be used for various purposes according to the invention. Firstly, it can serve for determining the signature mark by means of mark recognition. Secondly, it can serve for positioning the spectacle lens on a support and subsequently for determining a dioptric power of the spectacle lens.

The different beam paths can be positioned together wholly or in sections, in order to be able to carry out the method in the smallest possible space.

In a first variant, the illumination light beam is coupled into the beam path of the observation light beam. In a second variant, the measurement light beam is coupled into the beam path of the observation light beam. In a third variant, finally, the measurement light beam is coupled into the beam path of the illumination light beam.

In embodiments of the apparatus according to the invention, this is preferably done by corresponding beam splitters or other suitable optical means, for example drilled mirrors.

In connection with the beam splitters used, it is preferred to provide a light trap for a portion of the respective light beam which passes through the beam splitter.

if a beam splitter is provided for coupling the illumination light beam into the beam path of the observation light beam, this is preferably done in such a way that an entrance pupil of the camera and an exit pupil of the illumination light source or the illumination light source or an image thereof are conjugate with respect to said beam splitter.

In a further refinement, it may be preferred if the illumination light beam is masked out at least in the impingement region of the measurement light beam on the spectacle lens. This measure has the advantage of avoiding interactions which can occur as a result of the illumination light beam being incident on the sensor, which should only receive the measurement light beam.

In this case, it is particularly preferred if the illumination light beam is generated as a light beam that is ring-shaped in cross section. This is preferably done in apparatus terms by virtue of the fact that either the illumination source already generates an illumination light beam that is ring-shaped in cross section, or else the illumination light source comprises a transparency or slide having a light-opaque point in the beam path of the illumination light beam.

In further refinements of the invention, the illumination light beam and the measurement light beam have different light wavelengths. This measure, too, has the advantage that both light beams can be separated exactly from one another with regard to the electronic further processing. Preferably, the illumination light beam is generated as red light, i.e. in particular in a wavelength range of 650 to 750 nm, and the measurement light beam is generated as green light, i.e. in particular in a wavelength range of 490 nm to 575 nm.

Furthermore, it is preferably possible for the measurement light beam incident on the sensor to be passed through a filter which acts as a barrier filter for the light wavelength of the illumination light beam. This measure, too, contributes to separating the two beam paths from one another.

The retroreflector can be embodied as planar or curved. In particular, the retroreflector can be curved in the direction of the illumination light beam incident on it or in the direction of the spectacle lens.

Furthermore, in all refinements at least one fifth optical element, which in particular can have a spherical effect, can be arranged in the beam path of the illumination light beam between the spectacle lens and the retroreflector. In this way, the beam path of the illumination light beam can be influenced in particular in such a way that the illumination light beam is incident completely on the retroreflector. Particularly in the case of spectacle lenses having a strongly divergent power and relatively small retroreflectors, this may be necessary in order to direct a large portion of the illumination light beam or the entire illumination light beam onto the retroreflector.

Further advantages are evident from the description and the accompanying drawing. It goes without saying that the features mentioned above and those yet to be explained below can be used not only in the combination respectively specified, but also in other combinations or by themselves, without departing from the scope of the present invention.

BRIEF DESCRIPTION OF THE SEVERAL VIEWS OF THE DRAWING

Exemplary embodiments of the invention are illustrated in the drawing and are explained in greater detail in the following description. in the figures.

DETAILED DESCRIPTION OF THE INVENTION

Figure 1:
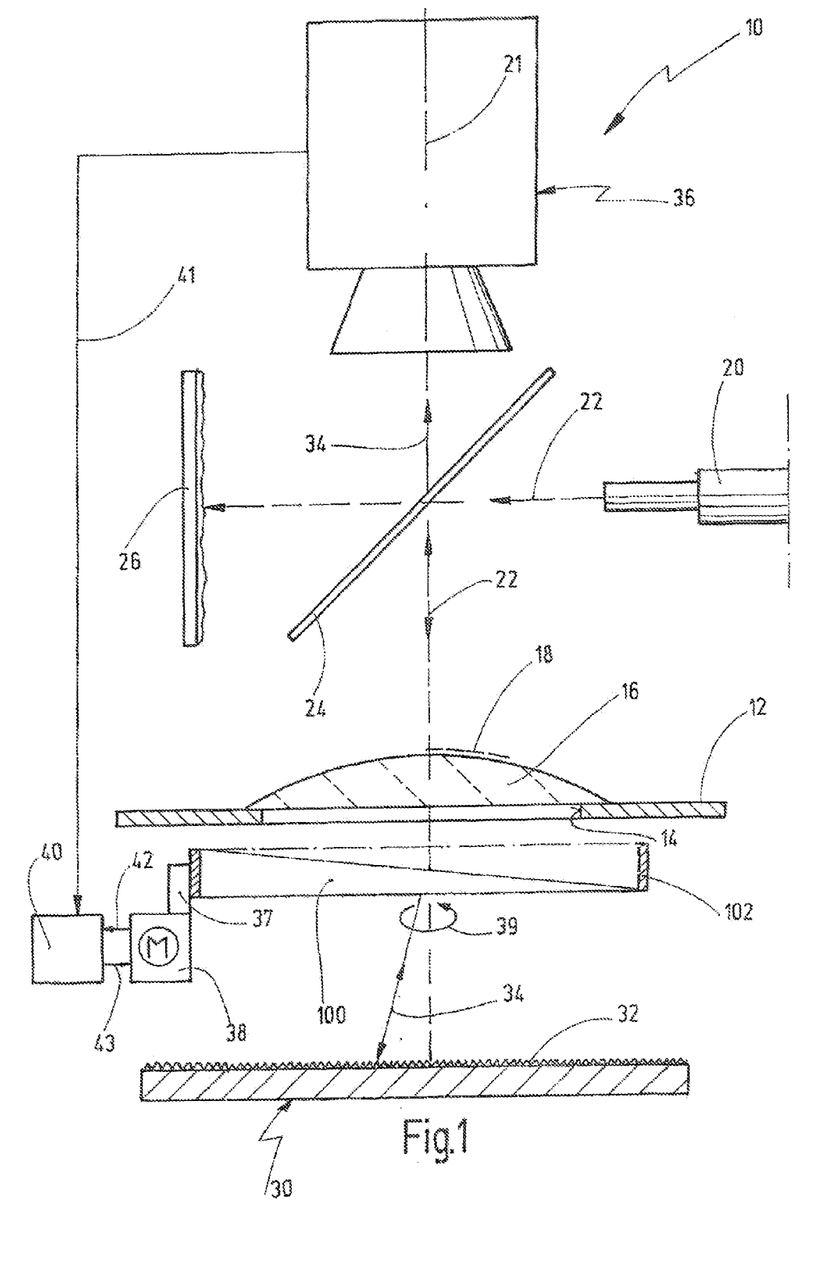
FIG. 1 shows an extremely schematic side view of a first exemplary embodiment of an apparatus according to the invention.

In FIG. 1, 10 designates a first exemplary embodiment of an apparatus according to the invention in its entirety.

A support 12 having a central cutout 14 is provided in the apparatus 10. A spectacle lens 16 is situated on the support 12 and across the cutout 14. The spectacle lens 16 is provided with a signature mark indicated at 18.

An illumination light source 20 is preferably oriented perpendicularly to the optical axis of the spectacle lens 16, said axis coinciding with the optical axis 21 of a camera 36 in the example illustrated. The illumination light source 20 emits an illumination light beam 22. The latter passes to a beam splitter 24, for example a partly transmissive mirror, and is reflected there in the direction of the optical axis 21 of the camera 36. A portion of the illumination light beam 22 emerging from the illumination light source 20, which portion passes through the beam splitter 24, is absorbed by a light trap 26 arranged behind the beam splitter 24.

The illumination light beam 22 travels through the spectacle lens 16 and passes through a first optical element 100, which, in the illustration in accordance with FIG. 1, is arranged below the spectacle lens 16 after or downstream of the spectacle lens in the beam path of the illumination light beam 22. The first optical element 100 is embodied as a prism having a wedge-shaped main surface. Consequently, the illumination light beam 22 is deflected depending on the wedge angle of the first optical element 100. The illumination light beam 22 subsequently impinges on a retroreflector 30.

The retroreflector 30 is provided with a retroreflective coating 32. It can also be embodied as a commercially available retroreflective film or as a retroreflector having regularly arranged triple mirrors or reflectively coated triple prisms.

The illumination light beam 7 reflected by the retroreflector 30 passes once again—in the opposite direction—through the first optical element 100, and the spectacle lens 16, and is then guided as an observation light beam 34 to the camera 36, for example a CCD camera. The camera 36 is focused on the spectacle lens 16 and generates an image of the spectacle lens 16 in which the signature mark 18 is visible against the background of the retroreflector 30.

The first optical element 100 is connected to a drive motor 38 via an actuating connection or an operative connection 37 (only indicated schematically), a shaft in the example illustrated. The drive motor 38 rotates the first optical element 100 about a vertical axis, which is preferably aligned with the axis 21 of the camera 36 and with the axis of the illumination light beam 22. This is illustrated by an arrow 39 in FIG. 1.

Since the illumination light beam 22 passes through the first optical element 100, the first optical element 100 should be mounted in such a way that the mounting and also the operative connection 37 and the drive motor 38 are not arranged in the beam path of the illumination light beam 22. For this purpose, an outer ring 102 is provided, into which the first optical element 100 is clamped. Provision can be made here, for example, for mounting the first optical element 100 in an outer ring of a ball bearing. A prism having a wedge-shaped main surface would then be mounted with its four corners in the outer ring. A rotation of the first optical element can be realized, for example, by injecting compressed air into the outer ring. However, provision can also be made, for example, for the first optical element to be fixedly clamped in the outer ring and for the outer ring itself then to be driven by means of the operative connection 37. By way of example, it is possible to wrap a continuous force transmission element, for example a belt, around the outer ring and to drive the latter by means of the motor 38. A wheel having a correspondingly adhering surface, for example a rubber coating, can also be placed directly on to the outer ring and be driven by the motor 38.

The term "prism having a wedge-shaped main surface" should be understood with regard to the optical effect of an optical clement 100 embodied in this regard on the illumination light beam 22. This does not in any way mean that the first optical element 100, in an embodiment as a prism having a wedge-shaped main surface, necessarily has to be embodied in a quadrilateral fashion in a cross section perpendicular to the main surface. It can also be embodied in a circular fashion in a cross section perpendicular to the main surface, such that it fills the outer ring 102 over the entire area.

Overall, what is of importance in the movement of the first optical element 100 is that the regular structures of the retroreflector 30 and dirt possibly adhering thereto are in this case blurred as motion blur.

A uniform pattern of individual elements, e.g. regularly arranged triple prisms or triple mirrors, is preferably used for the retroreflective coating 32 of the retroreflector 30. It may then be expedient to couple the movement of the first optical element 100 with vertical synchronizing pulses of the camera 36.

The circuitry illustrated in FIG. 1 is used for this purpose. The circuitry consists of an electronic control unit 40 connected to the camera 36 via a first electrical line 41 and to the drive motor 38 via a second electrical line 42. The electronic control unit 40, for its part, outputs control commands to the drive motor 38 via a third electrical line 43.

The vertical synchronizing pulses of the camera 36 are transmitted to the electronic control unit 40 via the first line 41. The motor 38 supplies encoder pulses via the second line 42, which encoder pulses are compared with the vertical synchronizing pulses in the electronic control unit 40. A control signal for the current or the voltage of the drive motor 38 is derived from this comparison, and is transmitted via the third line 43. In this case, the closed-loop control can bring about a rotational speed synchronization, that is to say that the rotational speed of the drive motor 38 is adapted to the frequency of the vertical synchronizing pulses. However, a phase-locked coupling is furthermore particularly preferred, such that a predetermined phase angle between the periodic movement of the drive motor 38 (for example the rotational movement) and the vertical synchronizing pulses of the camera 36 is also ensured.

What is achieved by using a moved first optical element 100 is that a virtual movement of the retroreflector is detected on account of the temporally varying propagation of the illumination light beam. The background against which the spectacle lens 16 is imaged in the camera 36 thus appears homogeneous. This therefore avoids the disadvantage of known arrangements in which another unsharp structure is also superimposed on the signature mark to be identified, which structure may even be of the order of magnitude of the signature mark to be identified. By contrast, if the first optical element 100 and thus the illumination light beam 22 are moved relative to the retroreflector 30, which is fixed in the embodiment illustrated, in the described manner, a homogeneous basic image can be subtracted during the image processing. In known apparatuses this is often not possible if only because the inhomogeneous background pattern is imaged in different sizes in the case of differently curved spectacle lenses. Furthermore, on account of the movement of the first optical element 100, this avoids a situation where parts of the illumination light beam 22 are blurred and other parts are not blurred or are blurred only very little, as is the case in known arrangements with a rotating retroreflector 30.

It is particularly advantageous during the observation of the contrasted image if the video signal of the camera 36 is additionally allowed to pass via a contrasting device. The latter performs e.g. a local convolution operation on the grey-scale values with a kernel, function which has differentiating character in a plurality of directions. For each pixel P[ij], where i specifies the row and j the column of the pixel, the sum $$A[i,j] = c * \sum_{ii,jj=1\ldots n} P[i-ii, j-jj] * K[ii,jj]$$

is thus calculated and the display values A[i,j] are displayed or the latter are processed further e.g. in a pattern recognition. In this case, n is the kernel length (e.g. n=3) and c is a suitable normalization factor. One suitable convolution kernel is e.g.:

$$K[ii,jj] = \begin{pmatrix} -1 & 0 & -1 \\ 0 & 4 & 0 \\ -1 & 0 & -1 \end{pmatrix} \text{ or}$$

$$K[ii,jj] = \begin{pmatrix} 0 & -1 & 0 \\ -1 & 4 & -1 \\ 0 & -1 & 0 \end{pmatrix} \text{ or}$$

$$K[ii,jj] = \begin{pmatrix} -1 & -1 & -1 \\ -1 & 8 & -1 \\ -1 & -1 & -1 \end{pmatrix}.$$

The contrasting function can be calculated continuously by means of a universal computer, for example, and the image (shortened at the edges of the image region in each case by a kernel length) can be displayed. It is even readily possible to implement such contrasting without a computer in hardware and to display the result in real time on a video screen. This requires a video digitizer and the same number of delay lines as the number of rows in the convolution kernel (that is to say n in the above notation) and a so-called convolver chip, such as is commercially available, for example, from Plessey with the designation PDSP 16488.

Figure 2:
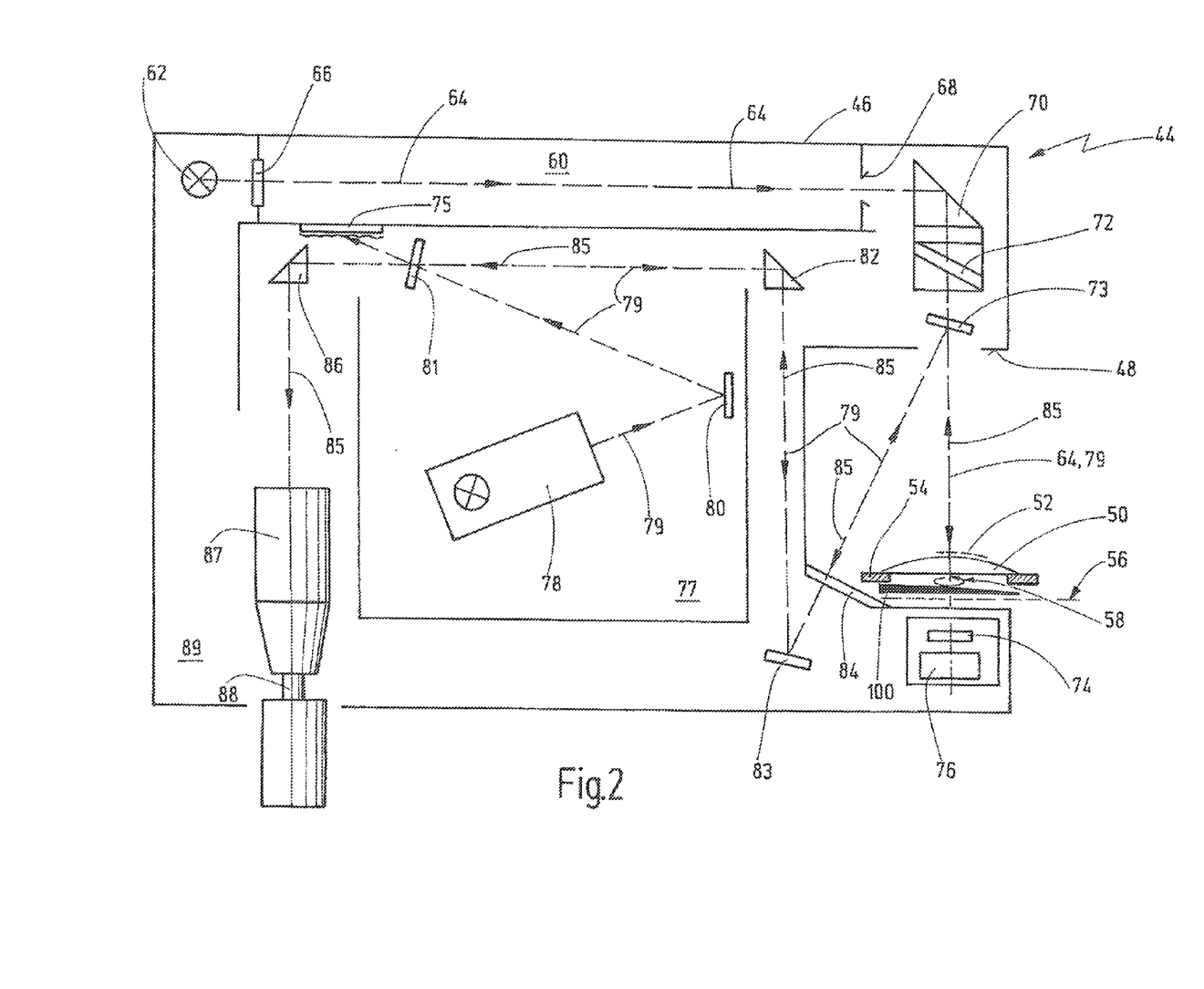
FIG. 2 shows a likewise schematic side view of a second exemplary embodiment of an apparatus according to the invention, namely of a vertex refractometer, wherein optical means for measuring a spectacle lens are additionally provided.

In the exemplary embodiment in accordance with FIG. 2, 44 designates an apparatus, namely a vertex refractometer, comprising a light-tight housing 46.

Only one signature mark 52 is depicted in FIG. 2. In reality, however, two signature marks are provided, which are situated at the predetermined distance above and respectively below the plane of the drawing. With their position, these two signature marks define that location of a spectacle lens 50 at which a physical property, e.g. the refractive power of the spectacle lens 50, is intended to be measured. A measurement light beam 64 is directed onto said location. For this purpose, the spectacle lens 50 is placed onto a support 54 by an operator and is manually oriented there relative to the signature marks 52. A commercially available vertex refractometer can be involved here. In the case thereof, the spectacle lens 50 is positioned during the measurement such that the signature marks 52 displayed in a contrasted fashion in the camera image lie at a predetermined location. Consequently, the signature marks 52 do not lie at the measurement location itself, but rather in a specific geometrical relation with respect thereto.

The housing 46 has an externally accessible cutout or opening 48 only on the right-hand side of FIG. 2. A receptacle for the spectacle lens 50 provided with the signature mark 52 is situated in said cutout 48.

A retroreflector 56, merely indicated schematically here, is situated below the spectacle lens 50, said retroreflector being rotatable by means of drive means (not illustrated), as indicated by an arrow 58. In this respect, the same statements as explained further above concerning the exemplary embodiment in accordance with FIG. 1 are applicable.

An upper chamber 60 is situated in the housing 46, a measurement light source 62 being arranged at the left end of said chamber. The measurement light source 62 emits a measurement light beam 64. The latter passes firstly through a first colour filter 66 and then through a diaphragm or aperture stop 68 before being deflected downwards in a prism 70 or a corresponding mirror. The measurement light beam 64 then passes through a prism compensator 72 and through a hole in a drilled or through-bored mirror 73 and then impinges on the top side of the spectacle lens 50. It passes through the spectacle lens 50 and also the first optical element 100 and then passes through a second colour filter 74, provided in a preferred development of the invention, before impinging on a sensor 76.

Alternatively, by means of a suitable optical guidance of the measurement light beam 64, provision can also he made for the latter not to pass through the first optical element 100, in order that the latter does not influence the measurement. Otherwise, the evaluation of the measurement should be evaluated on the basis of known optical properties of the first optical element 100. As a further alternative, provision can also be made for designing the first optical element as a mirror.

An illumination light source 78 is situated in a central chamber 77 of the housing 46, three exemplary embodiments of which illumination light source will be explained further below with reference to FIGS. 3 to 5.

The illumination light source 78 emits an illumination light beam 79. The latter passes firstly to a deflection mirror or deviation mirror 80 and then to a semitransparent mirror acting as a beam splitter 81. A portion of the illumination light beam 79 that passes through the beam splitter 81 is absorbed m a light trap 75 arranged behind the beam splitter 81. However, the illumination light beam 79 is substantially deflected towards the right by the beam splitter 81, so as then to impinge on a prism 82 or a mirror, which deflects the illumination light beam 79 downwards. After renewed deflection by a deflection mirror or deviation mirror 83, the illumination light beam 79 passes through a window 84 of the cutout 48 and impinges on the drilled mirror 73, which deflects the illumination light beam 79 once again downwards, where it impinges on the spectacle lens 50 and illuminates the signature mark 52.

The illumination light beam 79 reflected by the spectacle lens 50 or the signature mark 52 now forms an observation light beam 85, which firstly travels upwards and then passes via the drilled mirror 73, the deflection mirror 83, the prism 82 and the beam splitter 81 to a further prism 86 or a corresponding mirror, which deflects the observation light beam 85 downwards, where it passes via a lens 87 to a CCD camera 88. The prism 86, the lens or objective 87 and the CCD camera 88 are situated in a left chamber 89 of the housing 46.

The entrance pupil of the lens 87 and the exit pupil of the illumination light source 78 are conjugate with respect to one another with regard to the beam splitter 81.

The apparatus 44 in accordance with FIG. 2 operates as follows: in a measurement branch, the measurement light beam 64 from the measurement light source 62 is incident on the spectacle lens 50 in the manner described, passes through said spectacle lens and passes to the sensor 76. Physical properties of the spectacle lens can be measured in this way. For better differentiation from the illumination light beam 79 or from the observation light beam 85, the measurement light beam 64 is emitted with a different light wavelength, for example as green light, For this purpose, the first colour filter 66 is embodied as a green filter. By contrast, the second colour filter 74 before or upstream of the sensor 76 has the function of a barrier filter that does not allow other light wavelengths, in particular those of the illumination light source 78, to pass through. This prevents other light apart from the measurement light beam 64 from reaching the sensor 76.

At the same time, by means of the illumination light source 78, the illumination light beam 79 is directed onto the spectacle lens 50 in the manner described, in order to illuminate the signature mark 52 there. The reflected image of the signature mark 52 then passes as an observation light beam 85 to the CCD camera 88 and is evaluated as video signal there.

While this takes place, the first optical element 100 is moved below the spectacle lens 50 (arrow 58), to be precise in the manner described. In this case, the frequency of one of the abovementioned periodic movements of the retroreflector 56 is once again chosen such that it is adapted to a read-out frequency of the camera 88. Here, too, it goes without saying that it is possible to bring about a further contrasting by means of convolution operations of the type explained above, By means of the evaluation of the video signal of the CCD camera 88, as an alternative or in addition to the sensor 76, it is also possible to perform a measurement of a physical parameter of the spectacle lens 50.

Generally, however, it is endeavoured to decouple the measurement branch, on the one hand, and the illumination/observation branch, on the other hand, from one another.

Figure 3:
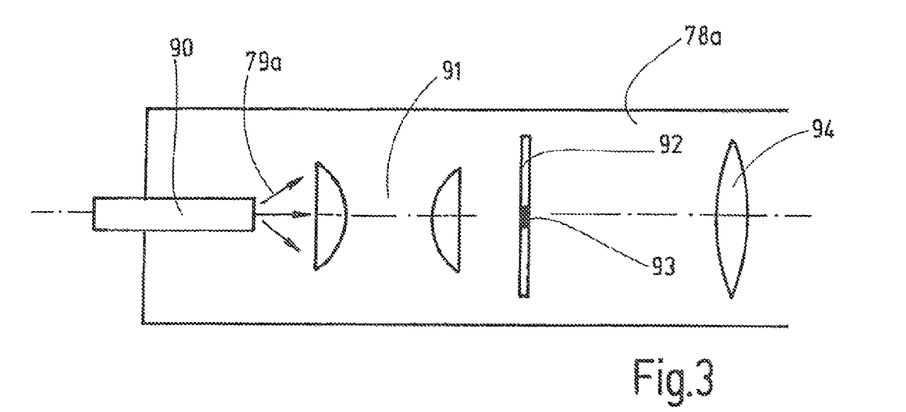
FIGS. 3-5 show three embodiments of illumination light sources such as can be used in the embodiments in accordance with FIGS. 1 and 2.
Figure 4:
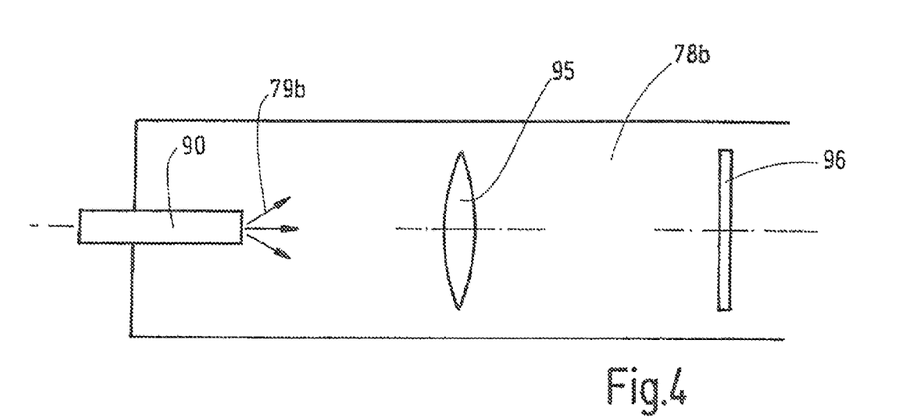
Figure 5:
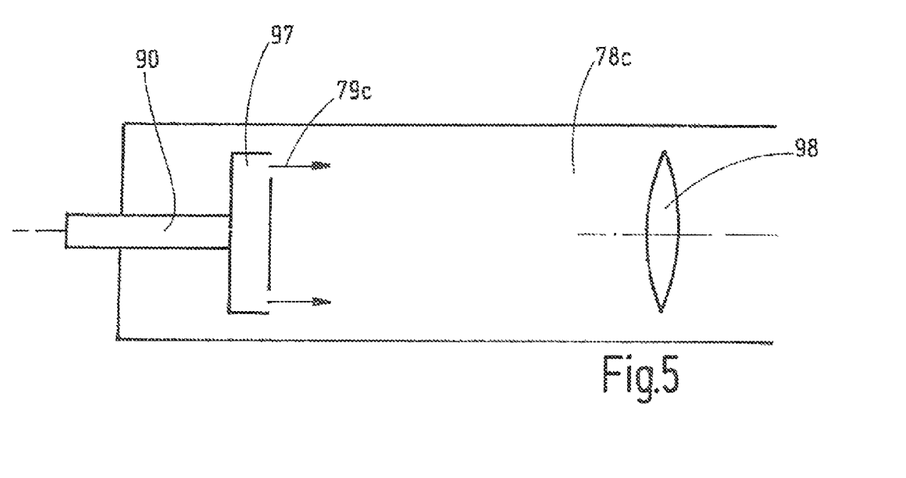

For this purpose, the illumination light source 78 is preferably designed as illustrated in three exemplary embodiments in FIGS. 3 to 5.

What is common to all three exemplary embodiments in accordance with FIGS. 3 to 5 is that the light is fed via an optical waveguide or lightguide 90. Of course, this does not preclude the fact that instead the light can also be generated in the illumination light source 78 itself, for example by a laser, a laser diode, an LED or such like.

In the exemplary embodiment in accordance with FIG. 3, in the illumination light source 78$a$, the optical waveguide 90 emits the illumination light beam 79$a$, which at this point is a divergent light beam. By means of a downstream collimation optical unit 91, the illumination light beam 79$a$ is parallelized and then passes to a transparent transparency or slide 92, which has a central black spot 93 only in the region of the optical axis. Via an imaging optical unit 94, the illumination light beam 79$a$ is then directed onto the deflection mirror 80 (FIG. 2).

As a result of the imaging of the central black spot 93 on the surface of the spectacle lens 50, what is achieved is that no illumination light penetrates into the opening—used for the optical measurement—of the tubular support 54. This is exactly the region in which the measurement light beam 64 impinges on the spectacle lens 50. Therefore, this prevents illumination light from being incident on the sensor 76 through the spectacle lens 50.

As has already been mentioned, the second colour filter 74 can also be provided upstream of the sensor 76, said colour filter acting as a barrier filter for the light wavelength of the illumination light. If the measurement light is green light, for example, then the illumination light can preferably be red light.

In the case of the second exemplary embodiment in accordance with FIG. 4, the illumination light source 78$b$ likewise has a collimation optical unit 95 for the divergent illumination light beam 79$b$ downstream of or behind the exit of the optical waveguide 90. In this case, a colour filter 96 is disposed in front of the collimation optical unit 95, which colour filter can be a red filter, for example, in the manner described above.

Finally, in the case of the third exemplary embodiment in accordance with FIG. 5, a ring exit or ring-shaped outlet 97 is provided at the free end of the optical waveguide 90 in the illumination light source 78$c$, said ring exit generating an illumination light beam 79$c$ that is ring-shaped in cross section. Said light beam is directed onto the deflection mirror 80 via an imaging optical unit 98.

Here, too, in a manner similar to that in the case of the exemplary embodiment in accordance with FIG. 3, a central shaded region arises in which no illumination light is incident on the surface of the spectacle lens 50 and in which the measurement light can be guided through the spectacle lens 50 onto the sensor 76.

Figure 6:
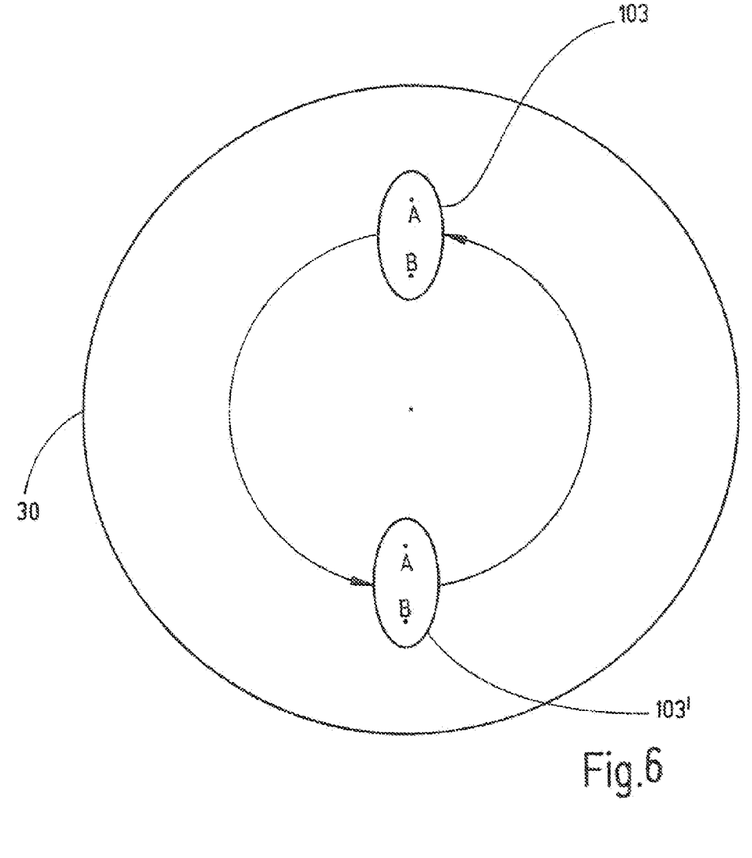
FIG. 6 shows, on an enlarged scale, a plan view of a retroreflector such as is used in the apparatus in accordance with FIG. 1, and a possible movement of a reflection region.

FIG. 6 schematically illustrates the apparent movement of a reflection region 103 on the retroreflector 30 that is generated in the exemplary embodiment in FIG. 1 if the optical power of the lens 16 is disregarded. The illumination light beam 22 then has a circular cross section, for example, before passing through the first optical element 100. As a result of its lateral deflection or by virtue of the fact that the reflective surface of the retroreflector 30 intersects the illumination light beam 22, an elliptical reflection region 103 arises on the reflective surface of the retroreflector 30, as is indicated in FIG. 6. A rotation of the first optical element 100 by 180° varies the reflection region 103, such that it then assumes a position indicated by the reference sign 103'. As a result of the rotation of the first optical element, which is embodied as a prism having a circular main surface and is rotated about an axis perpendicular to the reflective surface of the retroreflector 30, the reflection region 103 describes a circular path. In this case, an orientation of the reflection region 103 is maintained, however, as is illustrated by the position of the points A and B in the reflection regions 103 and 103'. Upon viewing the retroreflector 30 through the rotating first optical element, therefore, the impression arises that the retroreflector 30 describes a parallel rotary translation movement. In this way, with a relatively simple apparatus construction, a "virtual movement" of the retroreflector 30 is achieved, which, if it were desired to move the retroreflector 30 itself, could be implemented and balanced only with higher mechanical complexity.

Figure 7:
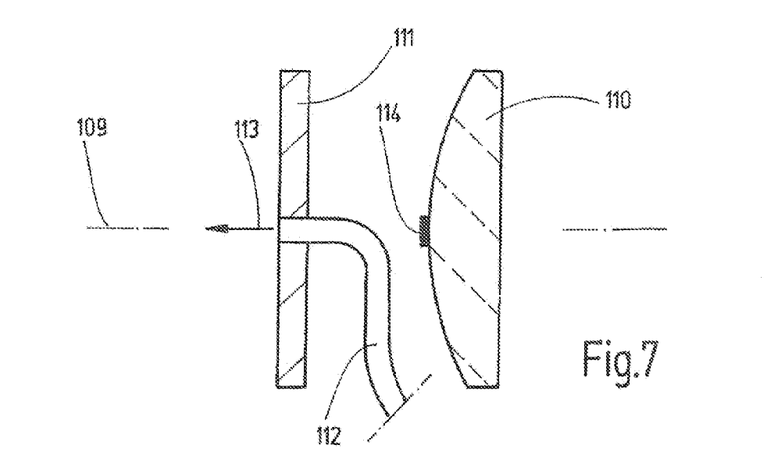
FIG. 7 shows a schematic side view for elucidating a further possibility for coupling in illumination light.

FIG. 7, finally, shows another variant, which operates without a beam splitter (cf. 24 in FIG. 1 or 81 in FIG. 2).

For this purpose, the illumination source is arranged centrally in front of the camera lens. In the example illustrated, a plane-parallel glass plate 111, which centrally carries the end of an optical fibre 112, is arranged transversely with respect to the axis 109 in front of the camera lens or camera objective 110. The illumination light beam 113 emerges from the optical fibre 112. In order to prevent light from coming back directly into the camera, a small region 114 on the camera lens 110 is blackened.

FIG. 8 illustrates schematic embodiments of the first optical element 100 which can he used as alternatives to the embodiment thereof as a prism having a wedge-shaped main surface. Identical elements are identified by identical reference signs and will not be explained in greater detail below. Only the relevant excerpt between the spectacle lens 16 and the retroreflector 30 is illustrated and described.

Figure 8A:
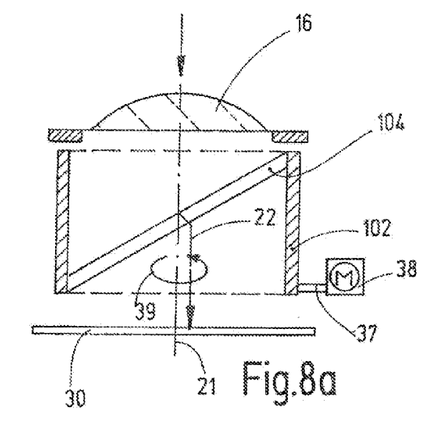
FIGS. 8a to 8d show schematic views of embodiments of the first optical element.

FIG. 8a shows an embodiment of the first optical element as a plane-parallel plate 104 tilted with respect to the optical axis 21. The plane-parallel plate 104 generates a parallel offset of the illumination light beam 22. A rotating movement 39 of the plane-parallel plate 104 can be brought about by means of a corresponding mounting of the plane-parallel plate 104 in an outer ring 102. A circular movement of the reflection region 103 on the retroreflector 30 can likewise be generated in this way.

Figure 8B:
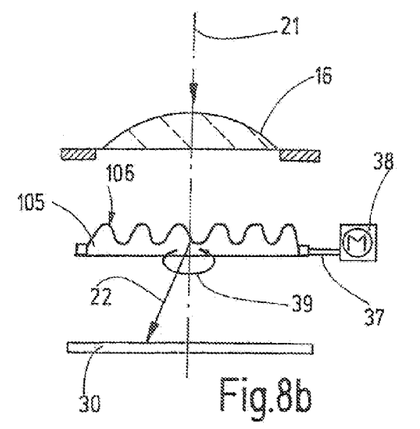

A plate 105 having an undulatory surface 106 is illustrated as the first optical element in FIG. 8b. in this case, it should be taken into consideration that the surface 106 is not perpendicular to the optical axis 21 or the axis of rotation of the plate 105, which coincide in this case. The undulatory surface 106 also generates a deflection of the incident light beam 22. As a result of rotation of the plate 105, a reflection region on the retroreflector 30 is once again varied in a circular fashion, even though in general a sharp delimitation of the reflection region 103 on the retroreflector 30 cannot be discerned, as explained in FIG. 6. A sufficient blurring effect can be obtained in this way, too.

Figure 8C:
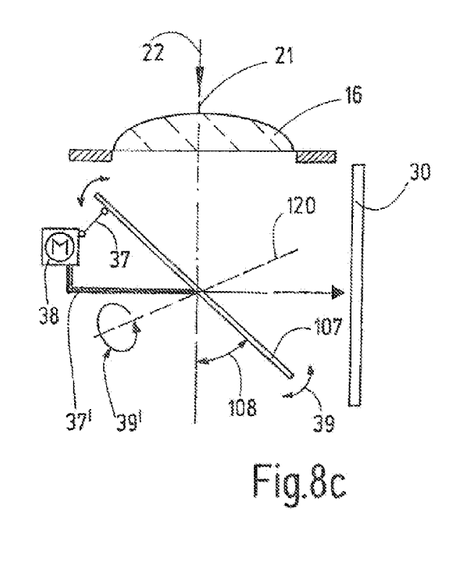

In FIG. 8c, the first optical element is designed as a mirror 107. In the embodiment illustrated, the retroreflector 30 is tilted by 90° in comparison with the other embodiments. The reflective surface of the retroreflector 30 runs parallel to the optical axis 21.

FIG. 8c illustrates two different possible ways of moving the mirror 107. Firstly, it is possible to vary an angle 108 of incidence of the illumination light beam 22 by tilting the mirror 107 relative to the incident illumination light beam. In this case, the reflection region 103 of the illumination light beam 22 on the retroreflector 30 is varied linearly. The mirror 107 is tilted in an oscillating fashion, as is indicated by an arrow 39.

Furthermore, provision can be made for the mirror 107 to be rotated in a wobbling fashion with an operative connection 37'. In this case, an axis of rotation 120 is oblique relative to a reflective surface of the mirror 107. The illustration by means of the operative connection 37' should he understood to be merely by way of example. The motor can then alternatively also be arranged on the axis of rotation 120, its output shaft being mounted on the mirror 107 at an angle not equal to 90°. A wobbling rotation of the mirror 107, as indicated by the arrow 99', also brings about a sufficient blurring effect. Merely for illustration purposes, an angle between the axis of rotation 120 and the reflective surface of the mirror 107 is illustrated in a manner deviating greatly from 90°. Just small deviations can be sufficient.

Figure 8D:
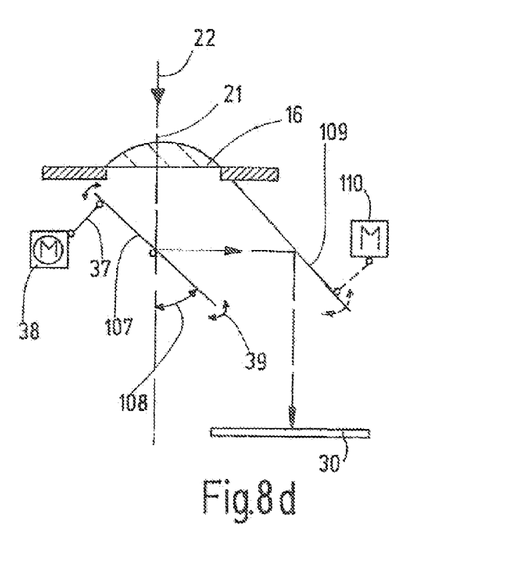

A further embodiment is provided in FIG. 8d, in which embodiment the first optical element is once again designed as a mirror 107 which is tilted in an oscillating fashion, as has been described above. Furthermore, however, a second mirror 109 is provided, which reflects the incident illumination light beam 22, for instance by 90°. The retroreflector 30 or the reflective surface thereof can then once again be arranged perpendicular to the optical axis 21 of the spectacle lens 16.

Furthermore, the second mirror 109 can also be provided with a drive motor 110 and be tillable about an axis, which, however, is not parallel to that of the first mirror. As a result of the interaction of both reflections, the illumination light beam 22 then describes a figure, e.g. a circular path, on the retroreflector 30.

Figure 9:
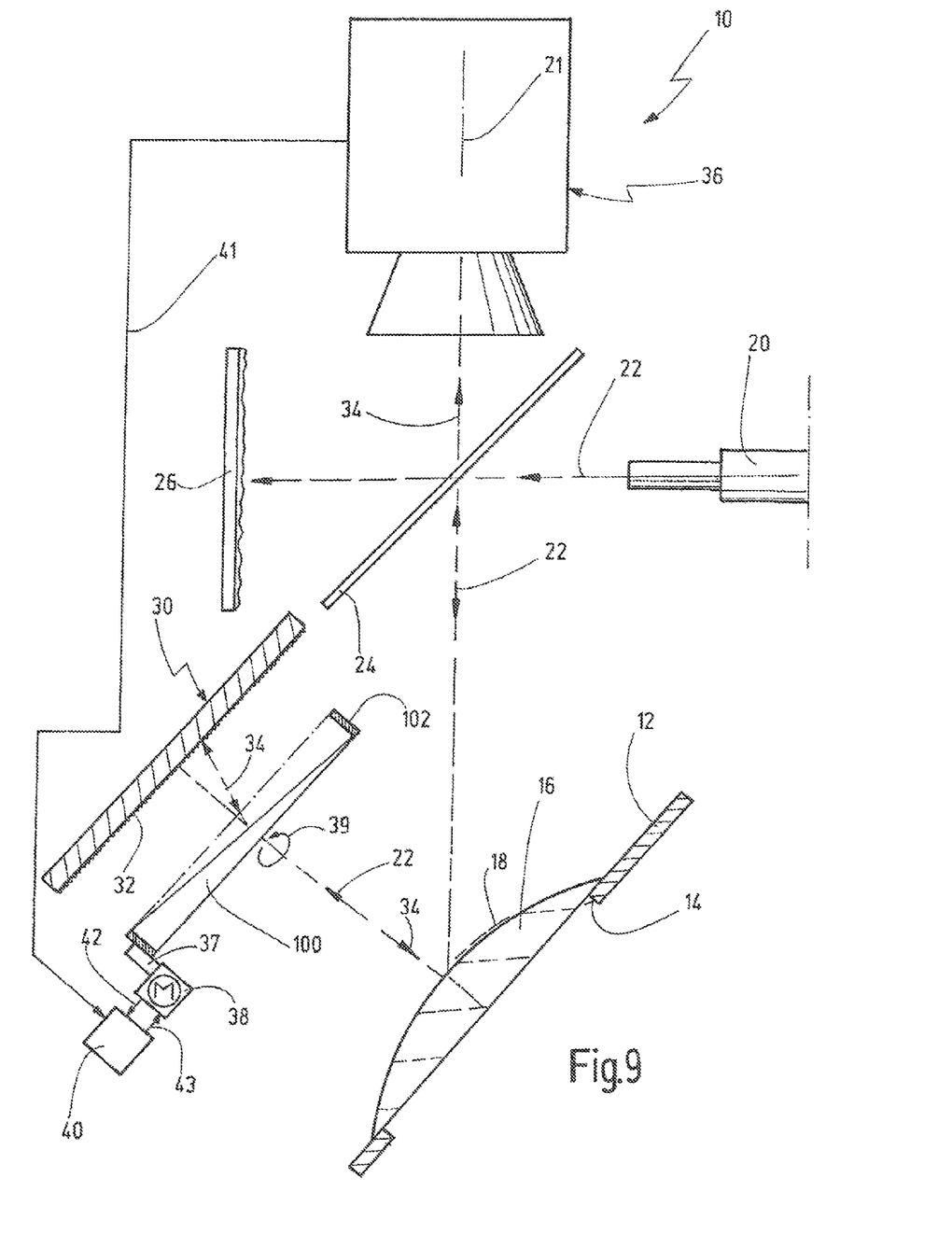
FIG. 9 shows an extremely schematic side view of a second exemplary embodiment of an apparatus according to the invention.

FIG. 9 shows an extremely schematic side view of a second exemplary embodiment of an apparatus according to the invention.

It goes without saying that the embodiments mentioned above can also be varied such that they are suitable for representing signature marks on a spectacle lens with high contrast, but in reflection rather than in transmission as portrayed above. FIG. 9 shows one possible reflective construction. In this case, identical elements are designated by identical reference signs and will not be explained again.

In this case, the lens 16 to be tested is observed at an angle with respect to its optical axis. The illumination light beam 22 reflected by the lens 16 impinges on the retroreflector 30 downstream of the lens, said retroreflector being moved virtually in its installation plane with the aid of the optical element 100. In the reflective arrangement, the retroreflector guides the illumination light beam 22 with a small beam offset (not illustrated for the sake of clarity) back to the lens 16, where it is reflected once again and finally passes back to the camera 36. In this variation, too, the effects are the same as discussed comprehensively for the case of a transmissive arrangement in FIGS. 1 to 8.

In order to sharply image the plane of the lens 16 uniformly in the case of such a reflective arrangement, it may be expedient to arrange the plane of focus through a Scheimpflug arrangement obliquely relative to the optical axis 21 of the observation lens. An application for a reflective arrangement is afforded, for example, if the lens 16 is still in a state in which that side of the lens 16 which faces away from, the camera 36 is not transparent.

What is claimed is:

1. A method for visualizing a signature mark on a spectacle lens, in which an illumination light beam is directed onto the spectacle lens, which impinges on the spectacle lens, after impinging on the spectacle lens is reflected at a reflector embodied as a retroreflector, impinges once again as an observation light beam on the spectacle lens, and finally is passed to a camera, wherein a reflection region of the illumination light beam on the reflector is varied by means of a moved first optical element, wherein the illumination light beam impinges on the first optical element downstream of the spectacle lens, and wherein the first optical element is moved by a drive device.

2. The method according to claim 1, wherein the reflector is fixed.

3. The method according to claim 1, wherein the reflection region of the illumination light beam on the reflector is moved linearly.

4. The method according to claim 3, wherein an angle of incidence of the illumination light beam on the first optical element is varied, wherein the first optical element is tilted in an oscillating fashion relative to the illumination light beam.

5. The method according to claim 1, wherein the reflection region of the illumination light beam on the reflector is moved circularly or elliptically.

6. The method according to claim 5, wherein the first optical element is rotated about an axis running substantially parallel to an optical axis of the spectacle lens.

7. The method according to claim 1, wherein the first optical element is a plane-parallel plate tilted with respect to an optical axis of the spectacle lens, a prism having a wedge-shaped main surface or a plate having at least one undulatory surface.

8. The method according to claim 1, wherein the first optical element is a mirror.

9. The method according to claim 8, wherein the mirror is rotated in a wobbling fashion.

10. An apparatus for visualizing a signature mark on a spectacle lens, comprising
an illumination light source arranged on a first side of the spectacle lens and for generating an illumination light beam, for identifying the signature mark;
a reflector embodied as a retroreflector and arranged on that side of the spectacle lens which is situated opposite the first side;
a camera for receiving an observation light beam coming from the spectacle lens;
wherein the apparatus furthermore comprises a first optical element for varying a reflection region of the illumination light beam on the reflector, wherein the first optical element is supported in a movable fashion, wherein the first optical element is arranged downstream of the spectacle lens in a beam path of the illumination light beam, and wherein the first optical element is coupled to a drive device for moving the first optical element.

11. The apparatus according to claim 10, wherein the reflector is embodied in a fixed fashion.

12. The apparatus according to claim 10, wherein the apparatus comprises a drive device, which is coupled to the first optical element in such a way that it tilts the first optical element in an oscillating fashion relative to the illumination light beam, in order to vary an angle of incidence of the illumination light beam on the first optical element.

13. The apparatus according to claim 10, wherein the apparatus comprises a drive device, which is coupled to the first optical element in such a way that it rotates the first optical element about an axis running substantially parallel to an optical axis of the spectacle lens.

14. The apparatus according to claim 10, wherein the first optical element is a plane-parallel plate tilted with respect to an optical axis of the spectacle lens.

15. The apparatus according to claim 10, wherein the apparatus furthermore comprises at least one optical guide element for guiding the illumination light beam through the spectacle lens.

16. The apparatus according to claim 15, wherein the optical guide element comprises at least one second optical element for guiding the illumination light beam through the spectacle lens; and at least one third optical element for guiding the observation light beam reflected through the spectacle lens by the reflector to the camera.

17. The apparatus according to claim 10, wherein the apparatus furthermore comprises at least one optical guide element for guiding the observation light beam reflected through the spectacle lens by the reflector to the camera.

18. The apparatus according to claim 10, wherein the first optical element is a prism having a wedge-shaped main surface.

19. The apparatus according to claim 10, wherein the first optical element is a plate having at least one undulatory surface.

20. The apparatus according to claim 10, wherein the first optical element is a mirror.

21. The apparatus according to claim 20, wherein the apparatus furthermore comprises a drive device coupled to the mirror in such a way that the drive device rotates the mirror in a wobbling fashion.

* * * * *

UNITED STATES PATENT AND TRADEMARK OFFICE
CERTIFICATE OF CORRECTION

PATENT NO.         : 8,823,926 B2
APPLICATION NO.    : 13/684398
DATED              : September 2, 2014
INVENTOR(S)        : Adalbert Hanssen et al.

It is certified that error appears in the above-identified patent and that said Letters Patent is hereby corrected as shown below:

In the Specification

In Column 1:
      Line 26: delete "sewing" and substitute -- serving -- therefor.

In Column 2:
      Line 67: delete "he" and substitute -- be -- therefor.

In Column 3:
      Line 27: delete "protection" and substitute -- projection -- therefor.

In Column 4:
      Line 37: add -- THE -- after "OF".
      Line 67: delete "retroteflector" and substitute -- retroreflector -- therefor.

In Column 5:
      Line 5: delete "shape," and substitute -- shape. -- therefor.
      Line 37: delete "he" and substitute -- be -- therefor.
      Line 53: delete "mariner" and substitute -- manner -- therefor.
      Line 60: delete "he" and substitute -- be -- therefor.
      Line 61: delete "givers" and substitute -- given -- therefor.
      Line 65: delete "he" and substitute -- be -- therefor.

In Column 6:
      Line 1: delete "he" and substitute -- be -- therefor.
      Line 4: delete "that" and substitute -- then -- therefor.
      Line 8: delete "he" and substitute -- be -- therefor.
      Line 14: delete "he" and substitute -- be -- therefor.
      Line 41: delete "fixed. in" and substitute -- fixed. In -- therefor.

Signed and Sealed this
Sixth Day of January, 2015

Michelle K. Lee
*Deputy Director of the United States Patent and Trademark Office*

CERTIFICATE OF CORRECTION (continued)
U.S. Pat. No. 8,823,926 B2

Line 49: delete "he" and substitute -- be -- therefor.
Line 66: delete "more" and substitute -- move -- therefor.

In Column 7:
Line 41: delete "tine" and substitute -- line -- therefor.
Line 44: delete "tens" and substitute -- lens -- therefor.
Line 54: delete "another, in" and substitute -- another. In -- therefor.

In Column 9:
Line 12: delete "he" and substitute -- be -- therefor.
Line 27: delete "he" and substitute -- be -- therefor.
Line 55: delete "he" and substitute -- be -- therefor.
Line 58: delete "flector, in" and substitute -- flector. In -- therefor.

In Column 11:
Line 19: delete "description. in" and substitute -- description. In -- therefor.

In Column 12:
Line 8: delete "beam 7" and substitute -- beam 22 -- therefor.
Line 47: delete "clement" and substitute -- element -- therefor.

In Column 13:
Line 29: delete "he" and substitute -- be -- therefor.

In Column 14:
Line 42: delete "hut" and substitute -- but -- therefor.

In Column 15:
Line 2: delete "he" and substitute -- be -- therefor.
Line 19: delete "m" and substitute -- in -- therefor.

In Column 17:
Line 55: delete "FIG. 8b. in" and substitute -- FIG. 8b. In -- therefor.

In Column 18:
Line 17: delete "he" and substitute -- be -- therefor.
Line 36: delete "tillable" and substitute -- tiltable -- therefor.

In Column 19:
Line 2: delete "from," and substitute -- from -- therefor.